United States Patent
Otsuka et al.

(10) Patent No.: US 6,556,491 B2
(45) Date of Patent: Apr. 29, 2003

(54) SEMICONDUCTOR STORAGE DEVICE AND METHOD OF TESTING THE SAME

(75) Inventors: Hidefumi Otsuka; Yuji Yamasaki, both of Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/871,932

(22) Filed: Jun. 1, 2001

(65) Prior Publication Data

US 2002/0040989 A1 Apr. 11, 2002

(30) Foreign Application Priority Data

Jun. 1, 2000 (JP) ........................................ 2000-164301

(51) Int. Cl.$^7$ ................................................. G11C 7/00
(52) U.S. Cl. ........................ 365/201; 365/200; 365/203
(58) Field of Search ................................. 365/201, 200, 365/203, 189.09, 210, 205, 230.06

(56) References Cited

U.S. PATENT DOCUMENTS 5,761,141 A * 6/1998 Kobashi et al. .............. 365/200

FOREIGN PATENT DOCUMENTS

JP   6-119777   4/1994

* cited by examiner

Primary Examiner—David Lam
(74) Attorney, Agent, or Firm—RatnerPrestia

(57) ABSTRACT

A dynamic random access memory (DRAM) whose charge-holding characteristic regarding a leak of an electric charge through the bit line is tested in a short time is provided. The DRAM comprises a memory cell array including memory cells arranged at intersections of word lines and bit lines, plural sense amplifiers disposed at a pair of the bit lines, plural bit line pre-charge circuits for pre-charging and equalizing a potential in the pair of the bit lines, and a switching circuit for selecting an ordinary operation mode or a test mode. It further comprises a word line deactivator for deactivating all of word lines in the test mode, a sense amplifier deactivator for deactivating all of sense amplifiers in the test mode, and a bit line potential fixing circuit for fixing the bit lines to the same logic level of a high or a low level in the test mode.

26 Claims, 11 Drawing Sheets

SEMICONDUCTOR STORAGE DEVICE AND METHOD OF TESTING THE SAME

FIELD OF THE INVENTION

The present invention relates to a semiconductor storage device, i.e., a dynamic random access memory (DRAM), suitable for testing a charge-holding time of a memory cell of in a short time, and to a method of testing the storage device.

BACKGROUND OF THE INVENTION

A capacity of a semiconductor storage device increases recently along with a progress in a large scale integration technology, and requires a longer test time. A system large scale integrated circuit (LSI) is further advanced in function and complicated. It is hence an important problem how to shorten the test time of the LSI to enhance the test efficiency and reduce the manufacturing cost.

A semiconductor storage device is tested under various test patterns in order to test whether the memory cell, a storage unit in the storage device, can be read and written correctly. A dynamic random access memory (DRAM) particularly includes a memory cell having volatile data, thus being tested whether the holding time of an electric charge stored in the memory cell satisfies the specification or not (a charge-holding characteristic). Therefore, for the DRAM, the charge-holding characteristic is generally tested.

FIG. 6 shows a circuit configuration of the memory cell of an ordinary DRAM, which consists of a single transistor and a single capacitor. In the diagram, the memory cell includes a memory cell capacitor (MC), a memory cell transistor (TWL), a word line (WL), a bit line (BL). A potential (VCP) is applied to a plate electrode of the memory cell capacitor. The plate electrode is an opposite electrode connected to the memory cell transistor.

The DRAM shown in FIG. 6 stores data with a small electric charge stored in the memory cell capacitor (MC). The stored charge disappears gradually due to a small leak current. The leak current may flow various routes. A leak current (A) flows to the plate electrode through an insulating film of the memory cell capacitor. A leak current (B) flows from a diffusion layer of the memory cell transistor to a semiconductor substrate. A leak current (C) flows through a gate insulating film of the memory cell transistor to the gate (the word line). A leak current (D) flows to an adjacent memory cell. A leak current (E) flows to the bit line through the memory cell transistor (a cut-off current between a drain and a source of the transistor). Methods for detecting these leak currents are required.

To test the charge-holding time of the DRAM, following method is usually employed:

1) Write data into all memory cells in a writing cycle;
2) Then, leave the cells for a specific time (a stand-by period); and
3) Then, read the data in a reading cycle.

The method enables defects due to the leak currents (A) through (C) to be detected. Modifying a writing pattern to, for example, a checker pattern enables defects due to the leak current (D) to be detected. For detecting defects due to the leak current (E), during the standby period, the potential of the bit line is set to that corresponding to an opposite logic against the stored data in the memory cell capacitor (MC). And thus, the voltage between the memory cell capacitor (MC) and bit line may be applied between the drain and the source of the memory cell transistor.

For example, data "1" is written in the memory cell capacitor (MC). Then, the word line is set in non-selected state, and a potential of data "0", an opposite data against data written in the memory cell, is applied to the bit line (BL), and this state is left for a specific time. Then, the data is read out, and it is tested whether the written data "1" is eliminated or not.

A circuit configuration of the conventional DRAM and a test method for realizing the above way will be explained below with referring to the drawings.

FIG. 7 shows a peripheral circuit of a memory cell array of the conventional DRAM. In FIG. 7, a memory cell array 1 includes memory cells 2 arranged in matrix. A pair of bit lines 3 (BL) and 4 (NBL) are connected to a sense amplifier (Amp) 5. When a sense-Amp-activating signal 13 (SE) starts (turns to a high (H) level), a sense-Amp driver 101 sets a node 102 (SAN) to a ground potential (0V) and sets a node 103 (SAP) to a supply voltage (VDD). Then, the sense amplifier 5 amplifies the potential between the pair of the bit lines. The drain of the memory cell transistor is connected to one of the bit lines, and the gate of the transistor is connected to a word line 6. A bit line pre-charge equalizer 7 sets the pair of the bit lines 3 (BL) and 4 (NBL) to a reference voltage 11 (VBP), for example, ½VDD, generated by a reference voltage generator 9 when a pre-charge signal 8 is activated and set to the H level.

FIG. 8 shows a reference voltage generator for generating the reference voltage of ½VDD. If a resistance 104 (R1) and a resistance 105 (R2) are sufficiently large, the voltage at a node 106 (N) equal to ½VDD. Voltages at a node 107 (NA) and a node 108 (NB) are equal to (VDD/2)+Vt and (VDD/2)−Vt, respectively, where the "Vt" is a threshold voltage of all transistors. And then an output voltage Vout of a node 106 is stabilized at ½VDD.

A method of testing a charge-holding characteristic regarding a leak to the bit line for a conventional circuit will be explained with referring to FIG. 7. First, data "1", i.e., data for storing a charge in the memory cell capacitor (MC) is written in each memory cell. Then, the word line 6 is activated, and the data in the memory cell connected to the word line 6 (WL0) is read out. As a result, for example, the bit line 4 (NBL) is set to data of "1" by the data read out and amplified by the sense amplifier 5, and the data of the bit line 3 (BL) is set to "0". That is, the bit line 3 (BL) pairing with the bit line 4 (NBL) is set to the opposite data of that of the memory cell. And with repeating reading the data for a specific time, the charge-holding characteristic of the memory cell connected to the bit line 3 (BL) is tested. That is, the charge-holding characteristic is tested because the data of the memory cell is set to data of "1" and the data of the bit line 3 (BL) is set to "0". After repeating reading the data for a specific time, the data of "1" written in each memory cell is read out. Then, after writing data of "1" in each memory cell again, and then, with activating a word line 60 (WL1), the charge-holding characteristic of the other bit line 4 (NBL) pairing with the bit line 3 (BL) is similarly tested. Therefore, the same as the above, after activating the word line 60 (WL1) and repeating reading data for a specific time, with reading the data "1" written in each memory cell, the charge-holding characteristic regarding a leak to the bit line 4 (NBL) in a whole memory is be tested.

A method of testing the charge-holding characteristic of a memory is proposed, for example, in Japanese Patent Laid-open No. 11-154400. The publication discloses an apparatus for applying a voltage corresponding to data written from the outside to a bit line pair by deactivating a word line in a test mode.

FIG. 9 shows a specific circuit in which data entering from an input/output terminal 110 (I/O) is put into a write amplifier 111, and written into a memory cell 2 through a column selector 112, a pre-charge equalizer 7, and a sense amplifier 5.

Receiving the data from the input/output terminal 110 (I/O), the circuit transmits opposite data in a pair of bit lines 3 (BL) and 4 (NBL) to each other. For example, when the bit line 3 (BL) is set to "1", the bit line 4 (NBL) is set to "0". When the word line is deactivated in a test mode, when data is entered from the input/output terminal 110 (I/O), opposite potentials are applied to the bit lines 3 (BL) and 4 (NBL), and thus, all bit lines can not be set to the same level simultaneously.

Therefore, to test the charge-holding characteristic regarding a leak to the bit line, it is required to dividing the test procedure into two phases, i.e., to set the potentials of the bit lines 3 (BL) and 4 (NBL) to the same level.

FIG. 10 shows a prior art in which a memory cell array is divided into four blocks. If the memory cell array is divided in plural sections as shown in the diagram, sense amplifier arrays 155, 156, 157 are disposed between divided memory cell blocks 151, 152, 153, 154.

FIG. 11 shows a specific circuit of a sense amplifier array. FIG. 11 shows a pair of the bit lines 3 (BL) and 4 (NBL), a sense amplifier 5, and a pre-charge equalizer 7. When a pre-charge signal 8 (BP) of the pre-charge equalizer 7 is at a high (H) level, the pair of the bit lines 3 (BL) and 4 (NBL) are set to a reference voltage 11 (VBP). Shared gate circuits 158 and 159 isolate a pair of bit lines in the memory cell array in memory cell blocks. That is, the gate circuits are used for activating the pair of the bit line in either right or left memory cell block of the memory cell blocks at both sides of the sense amplifier array.

Referring to FIG. 10, the operation of the pair of the bit lines will be described below. When a shared-gate-selecting signal 160 (IS01) of the sense amplifier array 155 is at the H level, the pairs of the bit lines in the memory cell block 151 in FIG. 10 are activated. And when a shared gate selecting signal 161 (IS02) is at the H level, the pairs of the bit lines of the memory cell block 152 in FIG. 10 are activated.

The operation of the memory will be explained with referring to FIG. 10 and FIG. 11. When the shared gate selecting signal is activated, a selecting gate 162 in FIG. 11 activates the pair of the bit line selected with a column address, and also activates the word line in the memory cell of the memory block selected with the shared-gate-selecting signal. The activated memory cell can read and write data. In the sense amplifier array, the sense amplifier 5, the pre-charge equalizer 7, shared gate circuits 158, 159, and the Y-selecting gate 162 are combined together to activate the bit lines 3 (BL) and 4 (NBL). The sense amplifier array having such function between memory cell blocks enables the DRAM to be read and written per each memory cell block.

However, for testing the charge-holding characteristic of all memory cells through the bit line in this structure, since the bit lines can be activated only per each memory cell block, all memory cells need to be tested per each memory cell block. And to induce a leak current from the memory cell through the bit line, since the data is inverted between the pair of the bit lines 3 (BL) and 4 (NBL), the bit lines need to be tested separately. Considering the above point, for testing the charge-holding characteristic regarding a leak to the bit line in the memory cell array shown in FIG. 10, each of the four blocks must be tested twice, and hence, the array need to be tested similarly totally eight times.

In the method of testing the charge-holding characteristic regarding a leak to the bit line in the conventional semiconductor storage device, data of the bit line and data written in the memory cell must be opposite to each other. If the data in the all memory cell is identical, the pair of the bit lines must be tested similarly twice. As the scale of the DRAM is recently becoming larger, the memory cell array is divided into several blocks, and the memory cell arrays activated in one memory cycle are limited in a part of the chip. In such storage device, for testing the charge-holding characteristic regarding a leak to the bit line entire memory, each memory cell activated simultaneously has to be tested twice in the above way, and the same operation is required for all memory cell blocks. That is, the DRAM needs to be tested similarly in totally 2N times, where N=(a total number of memory cell blocks)/(a number of memory cell blocks activated simultaneously). The greater the number of divisions N, the longer is the test time. In the future, when the capacity becomes much larger and the number of divisions N increases, the long test time becomes a more serious problem.

SUMMARY OF THE INVENTION

The semiconductor storage device comprises a DRAM circuit, a selecting circuit of selecting an ordinary operation mode and a test mode, and a circuit for deactivating, in the test mode, all word lines and all sense amplifiers, and setting all bit lines to the same logic level.

A semiconductor storage device capable of deactivating word lines and sense amplifiers, so that the test time of the charge-holding characteristic regarding a leak to the bit line of all memory cells can be shortened. As all bit lines can be set to same logic level, the memory device is tested only once. The invention presents a semiconductor storage device to be tested with activating all blocks at once, in the DRAM divided into several blocks and activated in each block. A method of substantially shortening the test time of the charge-holding characteristic regarding a leak to the bit line is also provided.

DESCRIPTION OF THE PREFERRED EMBODIMENTS

First Exemplary Embodiment

Figure 1:
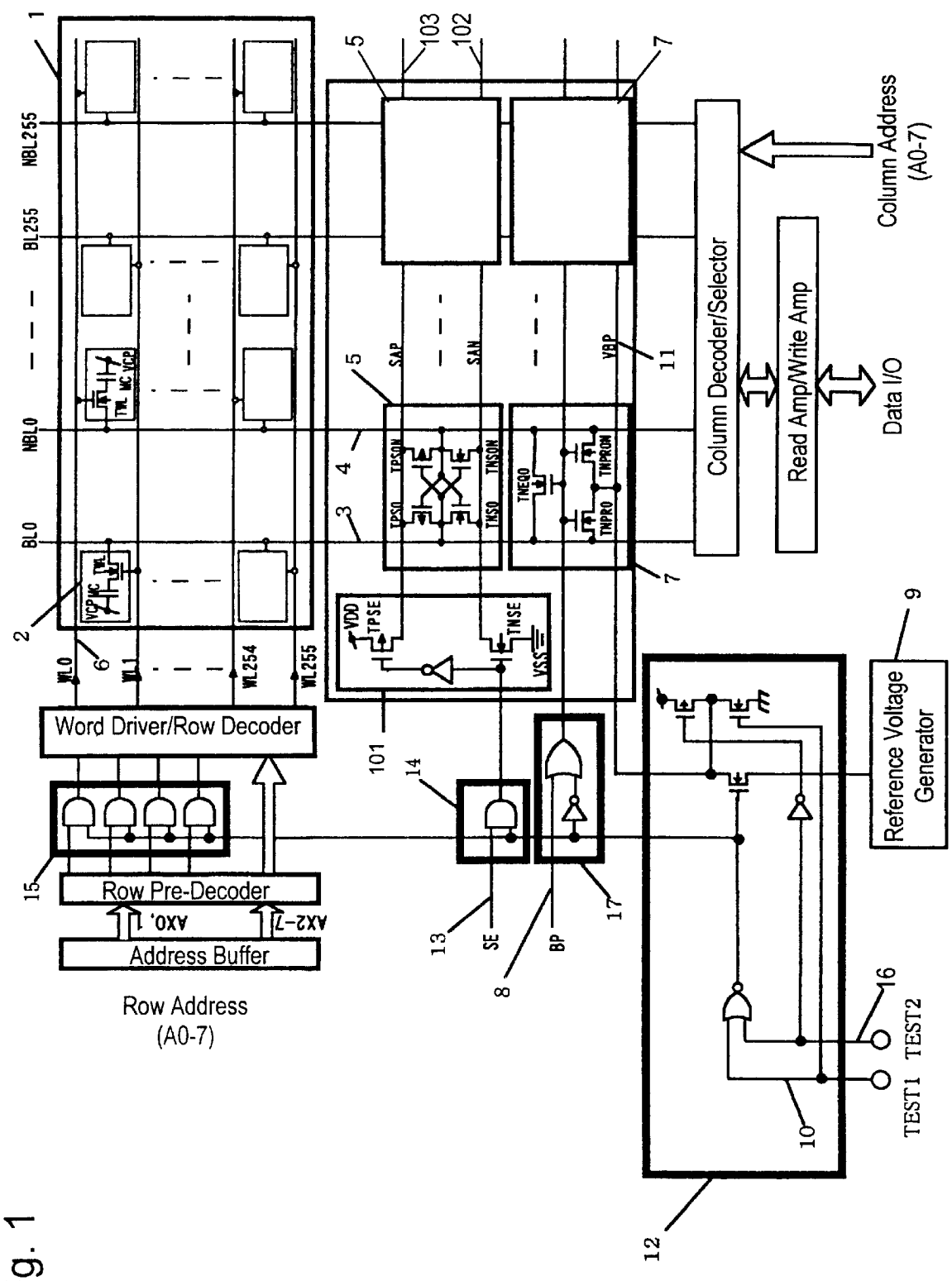
FIG. 1 is a block diagram showing an entire configuration of a semiconductor storage device according to a first exemplary embodiment of the present invention.

FIG. 1 is a block diagram showing an entire configuration of a semiconductor storage device according to a first exemplary embodiment of the present invention.

The semiconductor storage device shown in FIG. 1 has a memory array 1 composed of memory cells 2 disposed in matrix. A pair of bit lines 3 (BL) and 4 (NBL) are connected to a sense amplifier 5. When a sense-amplifier(AMP)-activating signal 13 (SE) is activated, i.e., set to a high (H) level, a sense AMP driver 101 sets a node 102 (SAN) to a grounding potential (0V) and sets a node 103 (SAP) to a supply voltage (VDD), and the sense amplifier 5 amplifies the voltage between the pair of the bit lines. The bit line is connected to the drain of a memory cell transistor, a memory cell capacitor (MC) is connected to the source, and a word line 6 is connected to the gate. A pre-charge equalizer 7 sets the pair of the bit lines 3 (BL) and 4 (NBL) to a reference voltage 11 (VBP) (for example, ½VDD) generated by a reference voltage generator 9 when a pre-charge signal 8 is activated.

The output voltage of the reference voltage generator 9 is controlled by a test signal 10 (TEST1) and a test signal 16 (TEST2). A voltage fixing circuit 12 sets the reference voltage 11 (VBP) to a grounding potential (0V) when the test signal 10 (TEST1) is at the H level. And the circuit 12 sets the reference voltage 11 (VBP) to a supply voltage (VDD) when the test signal 16 (TEST2) is at the H level.

Further, when the test signal 10 (TEST1) or the test signal 16 (TEST2) is at the H level, the semiconductor storage device comprises the following gate circuits:

A gate circuit 14 (an AND circuit) for fixing the sense-amplifier-activating signal 13 (SE) to a low (L) level in order not to activate a sense amplifier;

A gate circuit 15 (an AND circuit) for fixing the word line to deactivating level (the L level); and A gate circuit 17 (a logic circuit consisting of OR circuits and inverters) for fixing the pre-charge signal 8 (BP) at the H level.

The gate circuit 17 fixes the pair of the bit lines 3 (BL) and 4 (NBL) at the reference voltage 11 (VBP) through the pre-charge equalizer 7 when the test signal 10 (TEST1) or test signal 16 (TEST2) is at the H level. In a test mode, the reference voltage 11 (VBP) is set at the grounding potential or the supply voltage, each of which is different from an ordinary operation mode, by the voltage fixing circuit 12. At this time, in order to test and evaluate the charge-holding characteristic regarding a leak to the bit line, the gate circuits 14 and 15 deactivates the word line (WL) in each memory cell and the sense amplifier 5.

With the test signal 10 (TEST1) and test signal 16 (TEST2) set to the L level (an ordinary operation mode), data of "1" (which means that an electric charge is stored in the memory cell) is written in each memory cell preliminarily. Then, if the test signal 10 (TEST1) is set to the H level, the word line (WL) and the sense amplifier 5 are deactivated, and both bit lines 3 (BL) and 4 (NBL) are set to a grounding potential (0V) determined by the reference voltage 11 (VBP). While the test signal 10 (TEST1) is at the H level, the electric charge stored in each memory cell most inclines to leak through the bit line and the memory cell transistor. Therefore, the duration when the test signal 10 (TEST1) keeps the H level is directly evaluated as the charge-holding time regarding a leak to the bit line.

After data of "1" (which shows an electric charge is stored in the memory cell) is preliminarily written in each memory cell in the ordinary operation mode, the test signal 10 (TEST1) is set to the H level for a specific time, for which the charge-holding time is assured. Then the test signal 10 (TEST1) is set to the L level to return the storage device to the ordinary operation mode. Then, it is checked whether the data of "1" preliminarily written in each memory cell is read out correctly or not. In this way, the charge-holding characteristic regarding a leak to the bit line of all memory cells is tested at once efficiently.

With the test signal 10 (TEST1) and test signal 16 (TEST2) set to the L level (an ordinary operation mode), data of "0" (which means that an electric charge is not stored in the memory cell) is written in each memory cell preliminarily. Then, if the test signal 16 (TEST2) is set to the H level, the word line (WL) and the sense amplifier 5 is deactivated, and both bit lines 3 (BL) and 4 (NBL) are set to a supply voltage (VDD) level. While the test signal 16 (TEST2) is at the H level, an electric charge in each memory cell most inclines to leak through the bit lines and the memory cell transistor. Therefore, the duration when the test signal 16 (TEST2) keeps the H level is directly evaluated as the charge-holding time through the bit line.

After data of "0" (which shows an electric charge is not stored in the memory cell) is preliminarily written in each memory cell in the ordinary operation mode, the test signal 16 (TEST2) is set to the H level for a specific time, for which the charge-holding time is assured. Then the test signal 16 (TEST2) is set to the L level to return the storage device to the ordinary operation mode. Then, it is checked whether the data of "0" preliminarily written in each memory cell is read out correctly or not. In this way, the charge-holding characteristic regarding a leak to the bit line of all memory cells is tested at once efficiently.

Second Exemplary Embodiment

A semiconductor storage device according to a second exemplary embodiment of the present invention works with data of "0" in a bit line and the memory cell set to a potential raised from a grounding potential. The storage device works with the potential of data of "0" raised from the grounding potential, for example, by about a threshold voltage (Vt) of the transistor. The storage device also works with the potential of data of "1" in the bit line and the memory cell is lowered from the power supply voltage. The storage device works with the potential of data of "1" lowered from the power source voltage, for example, by about the threshold voltage (Vt) of the transistor.

Figure 2:
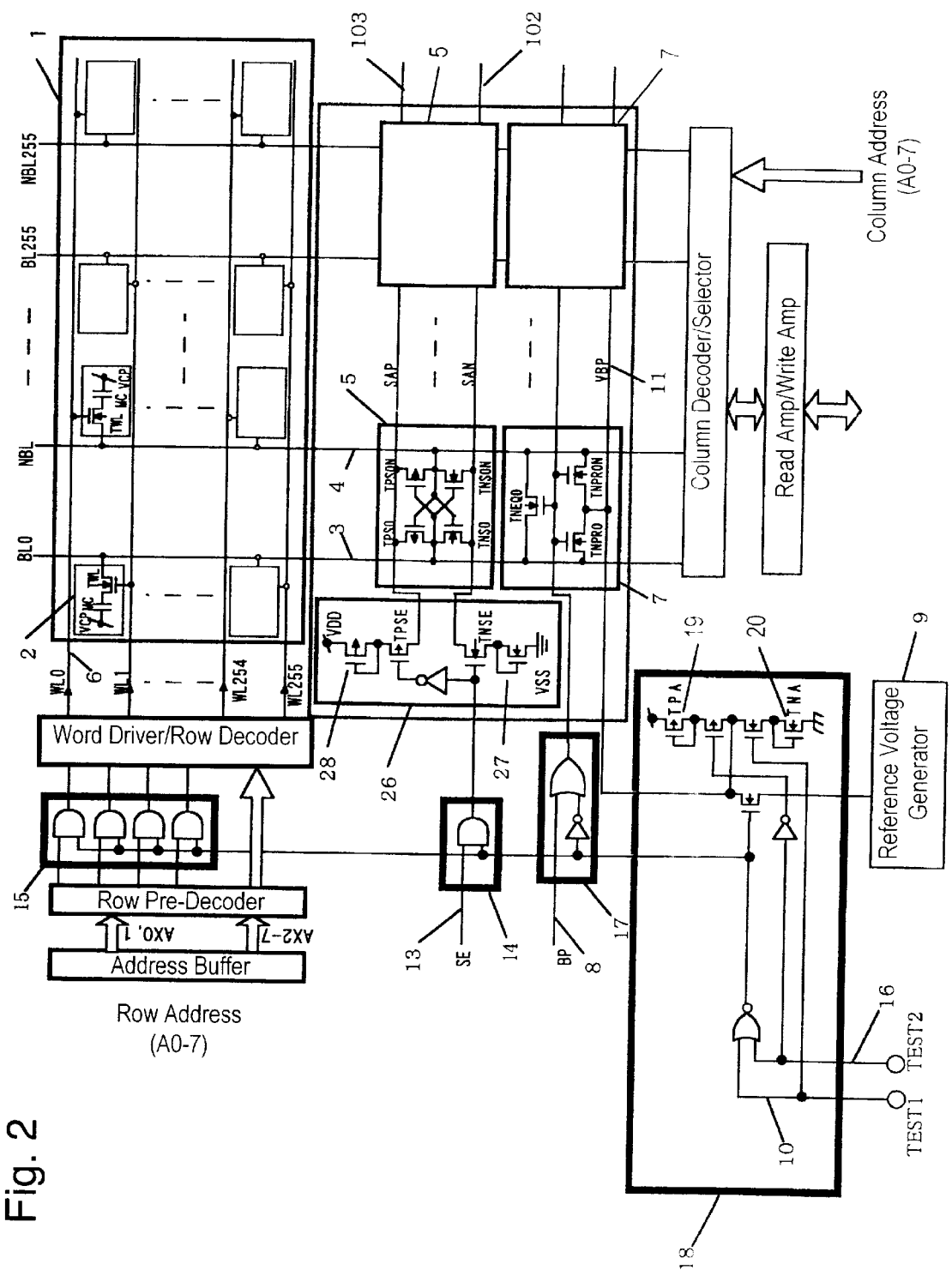
FIG. 2 is a block diagram showing an entire configuration of a semiconductor storage device according to a second exemplary embodiment of the present invention.

FIG. 2 shows a setting circuit for setting a pre-charge supply voltage in a test mode. In FIG. 2, the parts operating the same as in FIG. 1 are denoted with the same reference numerals, and the detailed explanation will be omitted.

Figure 7:
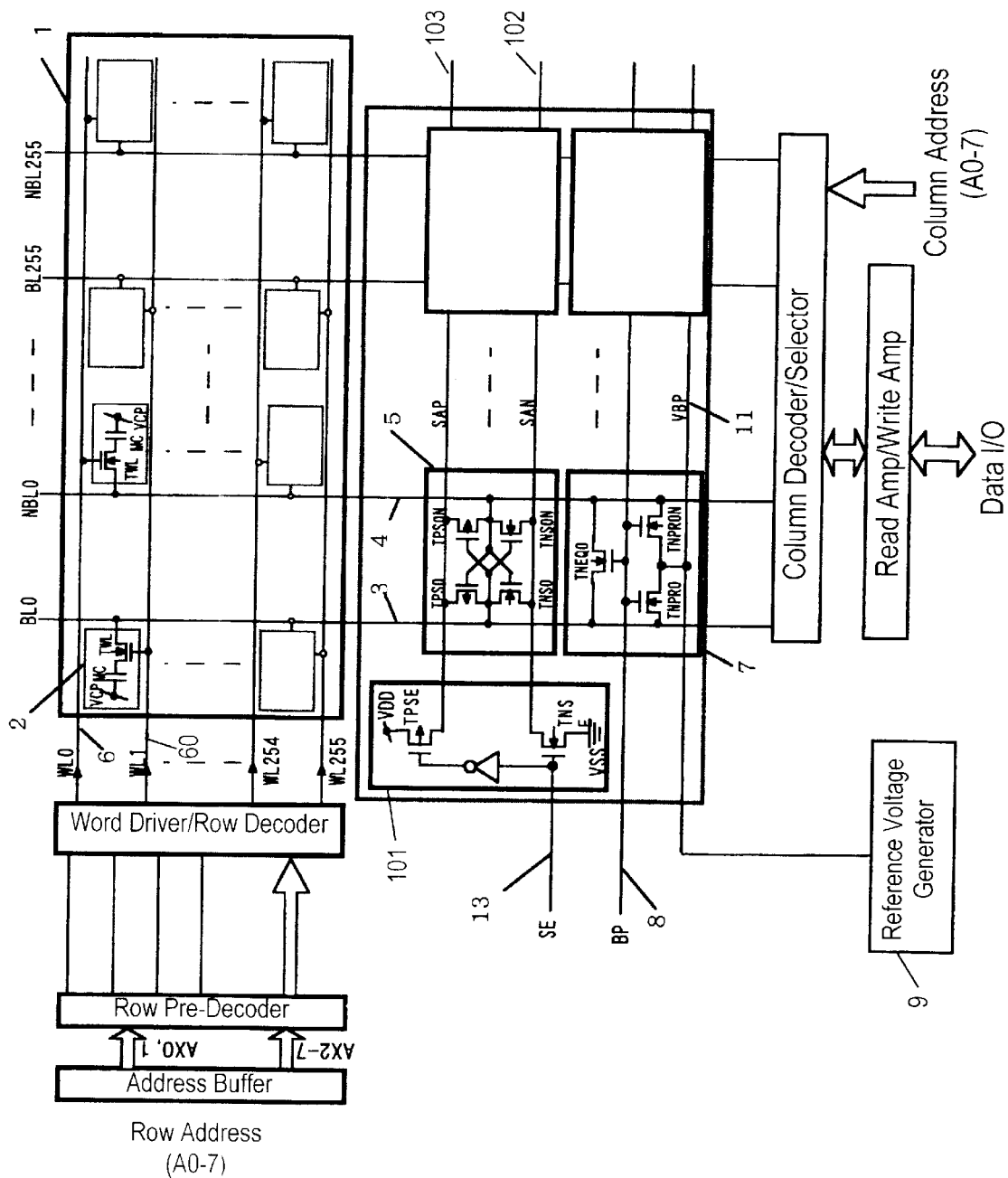
FIG. 7 shows a configuration of a conventional semiconductor storage device.
Figure 8:
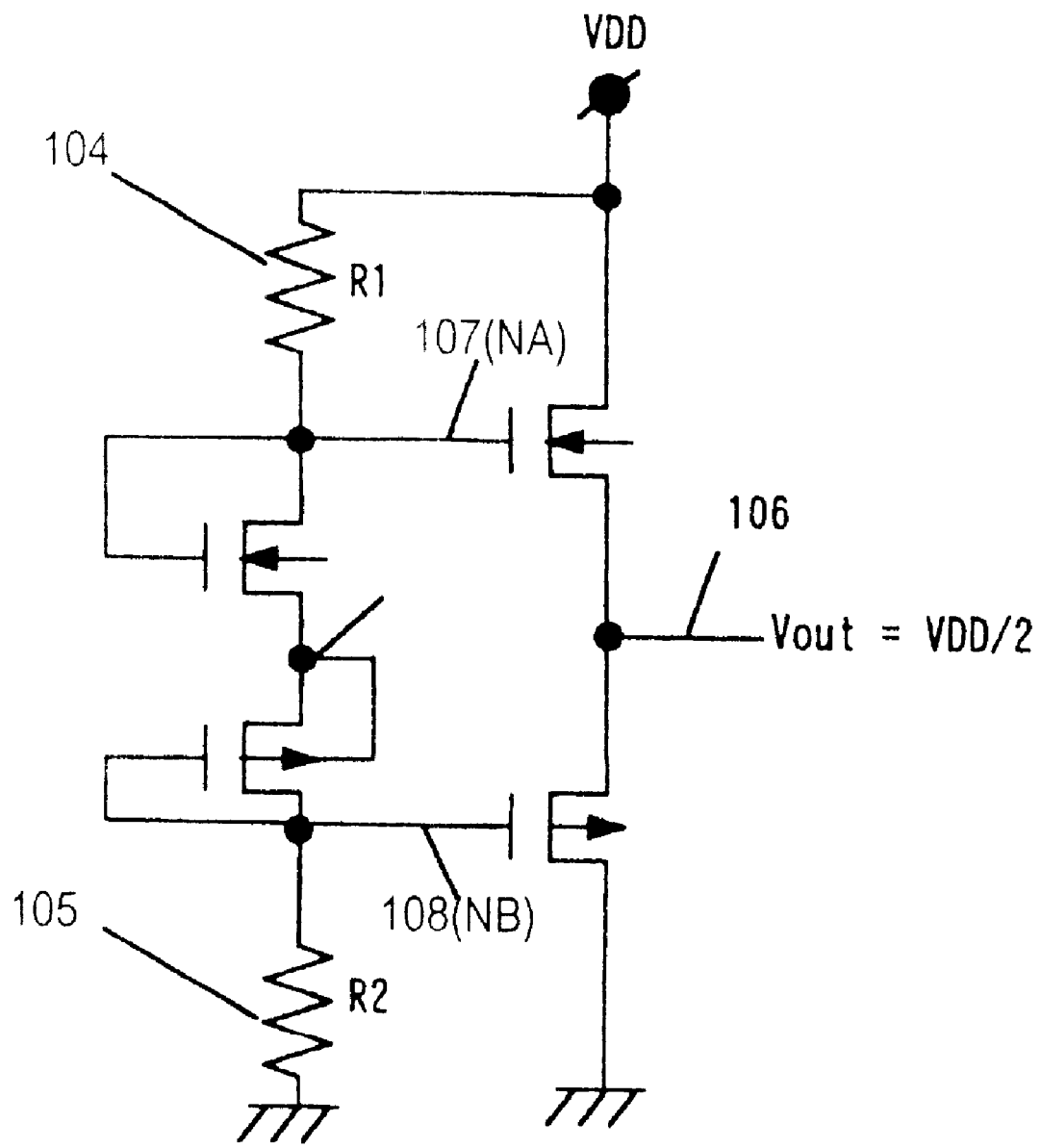
FIG. 8 shows a reference voltage generator in the conventional semiconductor storage device.
Figure 9:
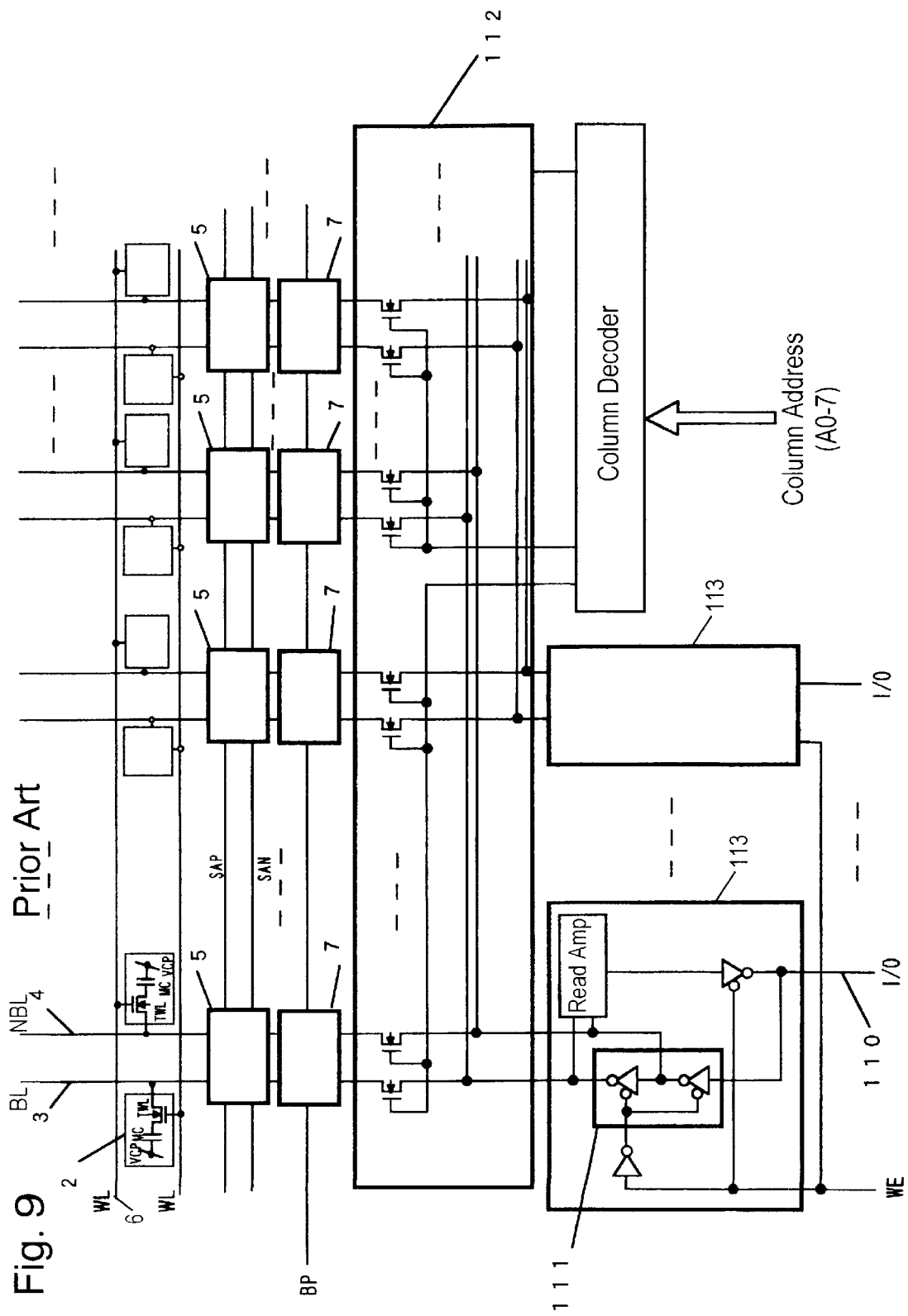
FIG. 9 shows a write amplifier in the conventional semiconductor storage device.
Figure 10:
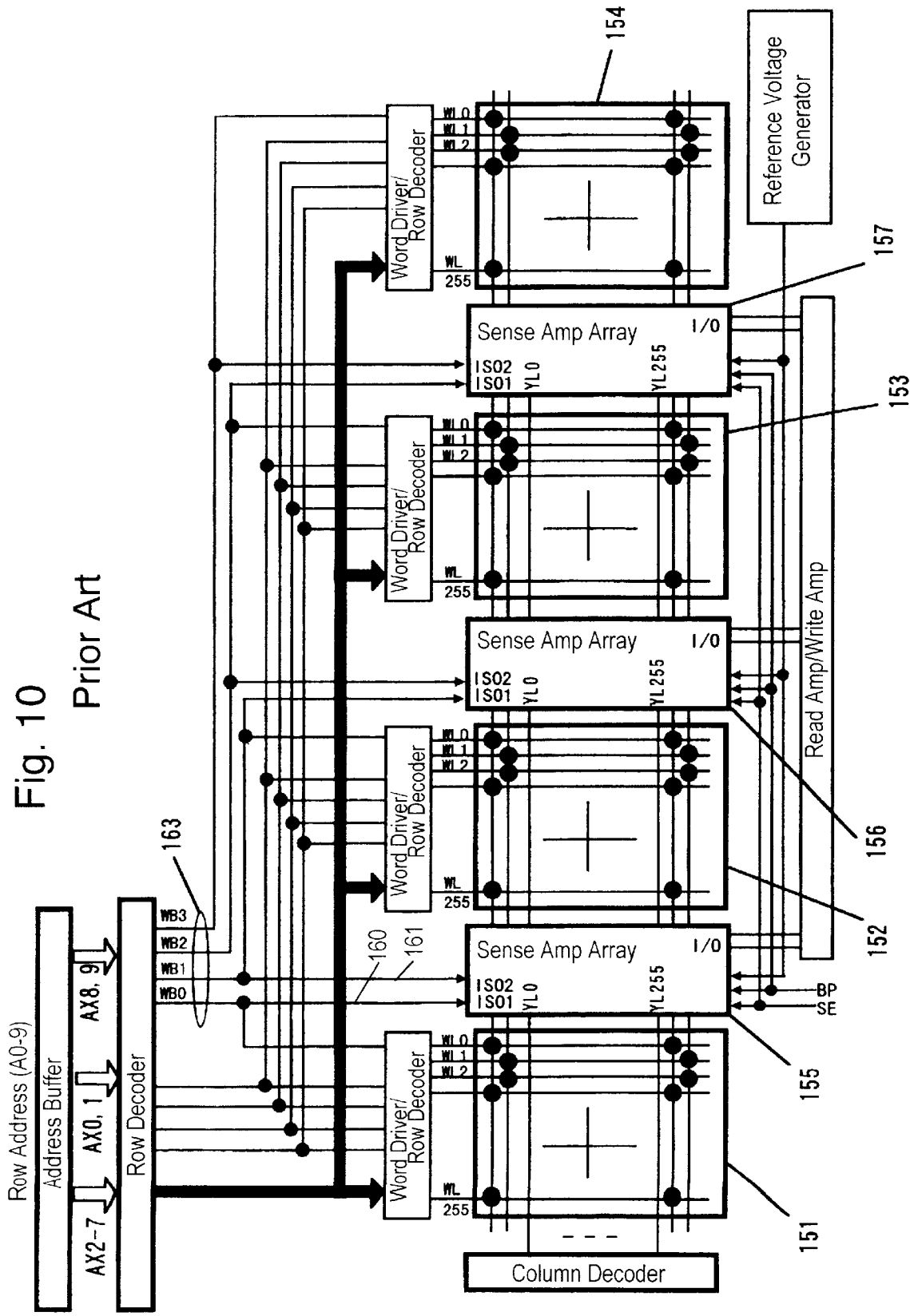
FIG. 10 shows a circuit configuration of a memory cell array divided into several blocks in the conventional semiconductor storage device.
Figure 11:
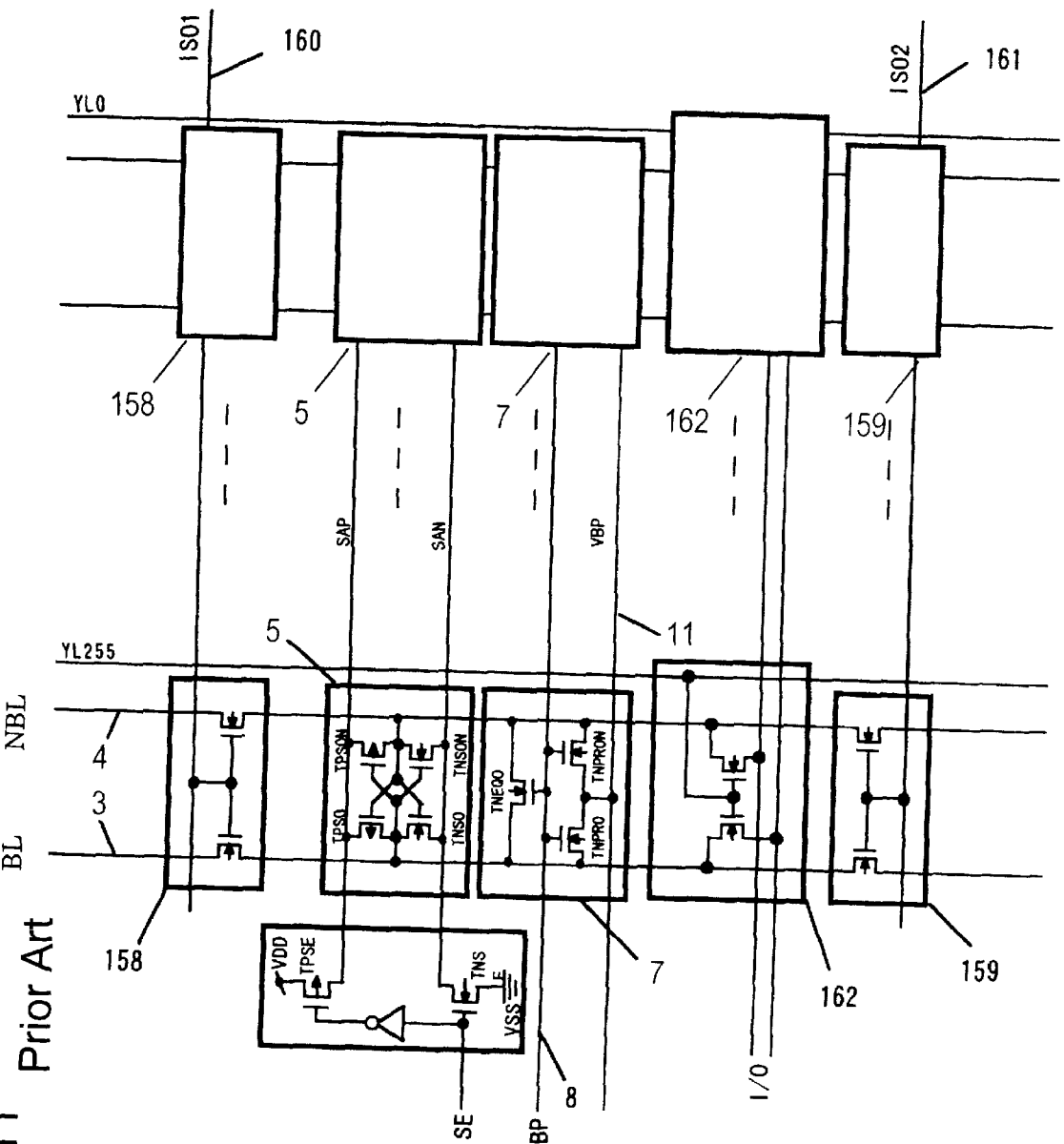
FIG. 11 shows a circuit configuration of a sense amplifier array in the conventional semiconductor storage device.

A sense amplifier (AMP) driver 26 shown in FIG. 2 is different from the sense AMP driver 101 shown in FIG. 1 and FIG. 7. In the second embodiment, when a sense-AMP-activating signal 13 (SE) is activated (set to a high (H) level), a transistor 27 sets a node 102 (SAN) to a voltage which is higher than a grounding potential level (0 V) by about a threshold voltage (Vt) of the transistor. And a transistor 28 sets a node 103 (SAP) to a voltage which is lower than a supply voltage (VDD) by about the threshold voltage (Vt) of the transistor. The semiconductor storage device shown in FIG. 2 works with data of "0" whose potential is raised from the grounding potential by about the threshold voltage (Vt) of the transistor. And it also works with data of "1" whose potential is lowered from the power source voltage by about the threshold voltage (Vt) of the transistor.

FIG. 2 shows a voltage fixing circuit 18, bit line voltage fixing means, in the test mode in the second embodiment. The circuit includes a transistor 19 (TPA) and a transistor 20 (TNA) additionally to the voltage fixing circuit 12 shown in FIG. 1.

In this configuration, setting the test signal 10 to the high (H) level deactivates the word line and the sense amplifier. And both bit lines 3 (BL) and 4 (NBL) are set to the following potential:

(A grounding potential)+Vt=(VSS+Vt).

And, setting the test signal 16 to the H level deactivates the word line and the sense amplifier. And both bit lines 3 (BL) and 4 (NBL) are set to the following potential:

(A power supply voltage)−Vt=(VDD−Vt).

As a result, data of "0" in the bit line and the memory cell is set to a potential raised from the grounding potential. Similarly, data of "1" in the bit line and the memory cell is set to a potential lowered from the power supply potential. For the semiconductor storage device working at such potentials, data of "1" or "0" is preliminarily written in each memory cell in an ordinary operation mode. Then the test signal 10 or test signal 16 is set to the H level, and thereby, the bit lines 3 (BL) and 4 (NBL) are fixed and held at a potential of an opposite data of that written in the memory cell for a specific time. Then, after the storage device is returned to the ordinary operation mode, it is checked whether the data written preliminarily in each memory cell is read out correctly or not. In this way, the storage device is tested under an actual operating condition.

The semiconductor storage device may have another test mode in which the fixed potential of data of "0" in the bit line is set to the grounding potential. A more critical leak current between the drain and source of the memory cell transistor than the ordinary operation enables the charge-holding characteristic to be tested in a shorter time.

The semiconductor storage device may have a further test mode in which the fixed potential of data of "1" in the bit line is set to the power supply voltage. A more critical leak current between the drain and source of the memory cell transistor enables the charge-holding characteristic to be tested in a shorter time.

Third Exemplary Embodiment

A semiconductor memory device according to a third exemplary embodiment is provided in which a fixed potential in a bit line is supplied from a write amplifier.

Figure 3:
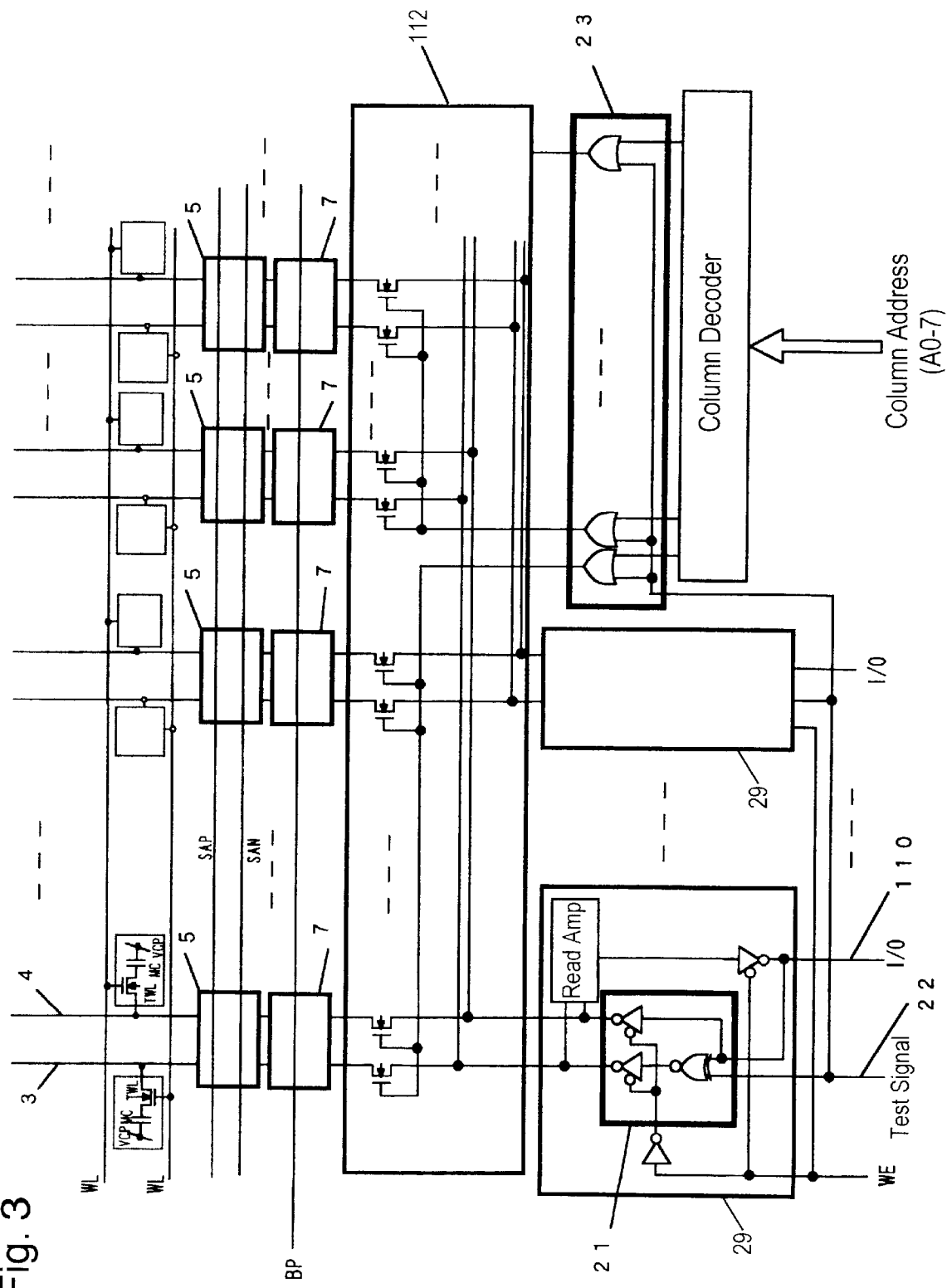
FIG. 3 is a block diagram showing an entire configuration of a semiconductor storage device according to a third exemplary embodiment of the present invention.

FIG. 3 shows a specific circuit of the semiconductor storage device in which a fixed potential for a bit line is supplied from a write amplifier 21. An input and output (I/O) interface 29 of the semiconductor storage device in FIG. 3 includes the write amplifier 21.

When a test signal 22 is at a low (L) level, input data at an input and output terminal 110 (I/O) itself appears at a bit line 3 (BL) through a column selector 112, and data inverted against the input data at the input and output terminal 110 (I/O) appears at a bit line 4 (NBL).

When the test signal 22 is at a high (H) level, the data inverted against the input data at the input and output terminal 110 (I/O) appears at both bit lines 3 (BL) and 4 (NBL) through the column selector 112. An OR circuit 23, which activates all column selecting signals when the test signal 22 is at the H level, activates all bit lines at the same time, and the write amplifier 21 fixes all bit line pairs to the same data. The data is input through the input and output terminal 110 (I/O) and is supplied into the bit lines through the write amplifier 21. The fixed potential for the bit lines is a potential of data inverted against the input data through the input and output terminal 110 (I/O).

In the semiconductor storage device having such configuration, in ordinary operation mode, preliminarily, data of "1" or "0" is written in each memory cell. Upon the test signal 22 being set to the H level, and upon the same data as the data written in the memory cells being input from the input and output terminal 110 (I/O), a pair of the bit lines 3 (BL) and 4 (NBL) are fixed and held at the potentials of data inverted against the input data for a specific time. After the storage device is returned to the ordinary operation mode, it is checked whether the data preliminarily written in each memory cell is read out correctly or not. In this way, the charge-holding characteristic regarding a leak to the bit line is tested in a shorter time more efficiently.

Fourth Exemplary Embodiment

A semiconductor storage device having a voltage fixing circuit for fixing a voltage in a bit line when a memory cell array is divided in plural blocks is provided.

Figure 4:
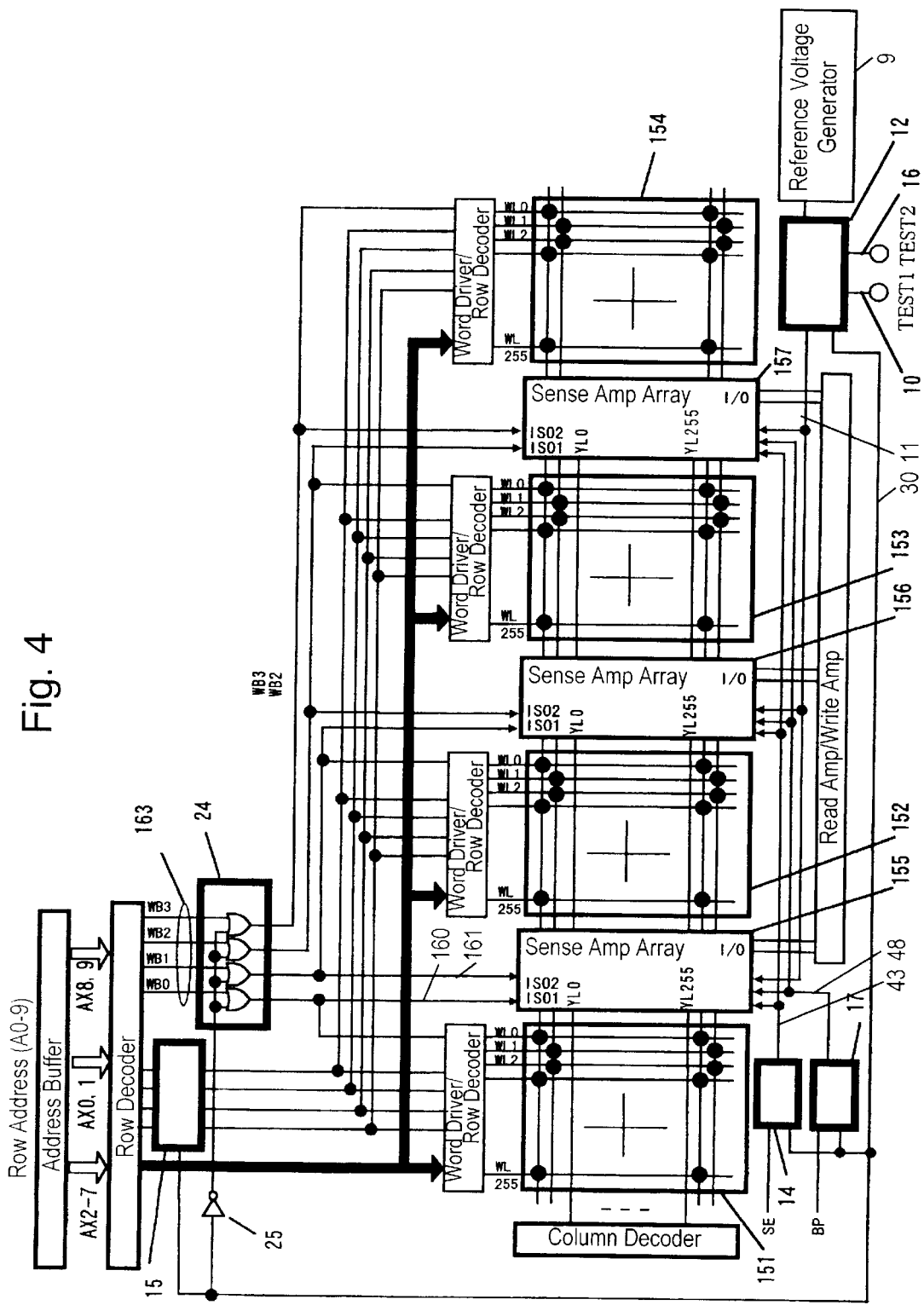
FIG. 4 is a block diagram showing an entire configuration of a semiconductor storage device according to a fourth exemplary embodiment of the present invention.

FIG. 4 shows the semiconductor storage device whose charge-holding characteristic regarding a leak to the bit line in all memory cells is tested with a single test. A voltage fixing circuit 12, a gate circuit 14, a gate circuit 15, and a gate circuit 17 are same circuits as shown in FIG. 1. When a test signal 10 or test signal 16 is at a high (H) level, a test signal 30 is set to a low (L) level, and the voltage fixing circuit 12 sets the output voltage of a reference voltage generator 9 to a grounding potential or a supply voltage. When the test signal 30 is at the L level, the gate circuit 14 deactivates all sense amplifiers, the gate circuit 15 deactivates all word lines, and the gate circuit 17 supplies the reference voltage 11 to the pair of the bit lines 3 (BL) and 4 (NBL).

Figure 5:
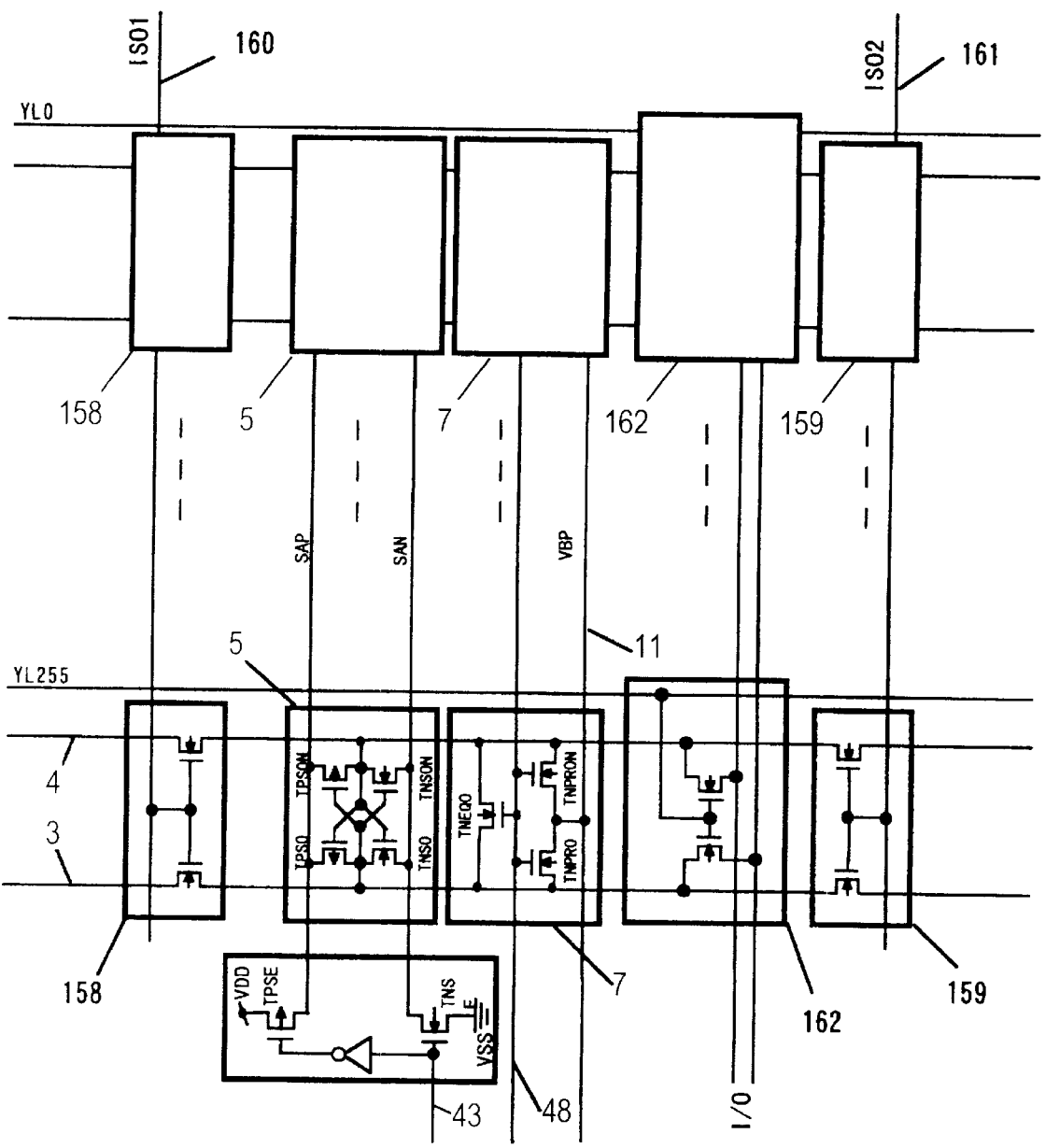
FIG. 5 shows a circuit configuration of a sense amplifier array of the semiconductor storage device according to the fourth embodiment.
Figure 6:
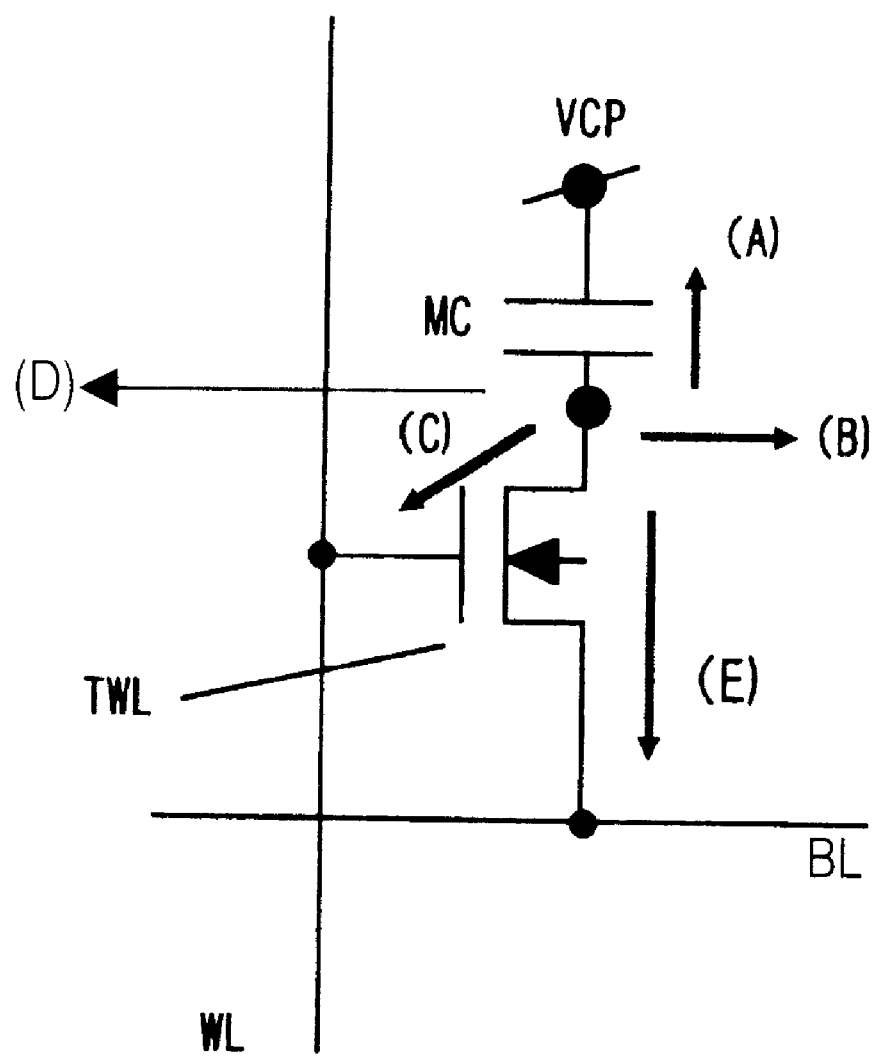
FIG. 6 shows leak currents of a memory cell.

FIG. 5 shows a circuit configuration of a sense amplifier array according to the embodiment. A sense-amplifier-activating signal 43 is output from the gate circuit 14, and a pre-charge signal 48 is output from the gate circuit 17.

Even if the memory cell array is divided into plural blocks, an OR circuit 24 and an inverter 25 shown in FIG. 4 activates all bit lines when the test signal 30 is set to the L level to turn on all of shared gate circuits 158, 159 shown in FIG. 5

The test signal 30, which is input to the inverter 25 shown in FIG. 4, is set to the L level when either the test signal 10 or test signal 16 is set to the H level, otherwise the signal 30 is set to the H level. Therefore, when either the test signal 10 or 16 is at the H level, the outputs of all OR circuits 24 are at the H level, and the shared gate circuits 158, 159 are turned on, and all bit lines are activated. Incidentally, in ordinary operation mode (when both test signals 10 and 16 are at the L level), the block selecting signals 163 (WB0 to WB3) depend upon row address input data. And only one of the block selecting signals 163 (WB0 to WB3) is set to the H level and issued as each shared gate selecting signal.

In the semiconductor storage device having such configuration, in ordinary operation mode, data "1" or "0" is primarily written in each memory cell. Upon the test signal 10 or test signal 16 being set to the H level to turn on all of shared gate circuits 158, 159, the pair of the bit lines 3 (BL) and 4 (NBL) of all blocks are fixed and held at the potential of data opposite to the data written in the memory cell for a specific time. Then, in the ordinary operation mode, it is checked whether the data preliminarily written in each memory cell is read out correctly or not. In this way, the charge-holding characteristic regarding a leak to the bit line of all memory cells is tested at once.

In this embodiment, in the test mode where the reference voltage 11 is set to a different voltage (i.e., the grounding voltage or supply voltage) than that in the ordinary operation mode, the charge-holding characteristic regarding a leak to the bit line of the memory cell array divided into blocks is tested. The write amplifier in the third embodiment may fix the potential in the bit lines.

As described above, according to the invention, after data of "1" is written in each memory cell in the ordinary operation mode, all bit lines are set to the grounding potential or the potential of data of "0" in the memory cell in the test mode. A leak of an electric charge from the memory cell through the bit line is thereby tested at once.

Also according to the invention, after data of "0" is written in all memory cells in ordinary operation mode, all bit lines are set to the power source voltage or the potential of data of "1" written in the memory cells. A leak of an electric charge through the memory cell from the bit lines is thereby tested at once.

Thus, with a single test, the charge-holding characteristic regarding a leak to the bit line is tested. And thus, the test time of testing the charge-holding characteristic may be shortened to the half of the time required in the prior art.

In particular, in the case that all memory cells are divided into blocks and activated partly in the ordinary operation mode, a circuit for turning on all of the shared gates activates the bit lines of all memory cells at once in the test mode. And therefore, the test time of testing the charge-holding characteristic is substantially shortened, and hence, the semiconductor storage device according to the present invention improves the test efficiency.

What is claimed is:

1. A semiconductor storage device comprising:
    a plurality of word lines;
    a plurality of pairs of bit lines;
    a plurality of memory cells disposed at intersections of said word lines and said bit lines, respectively, each of said memory cells including:
        a capacitor; and
        a transistor having a drain coupled to a respective one of said bit lines, a source coupled to said capacitor, and a gate coupled to a respective one of said word lines;
    a plurality of sense amplifiers coupled to said pairs of said bit lines, respectively, said sense amplifiers amplifying voltages between said pairs of said bit lines, respectively;
    a plurality of bit line pre-charge circuits disposed at said pairs of said bit lines, respectively, said bit line pre-charge circuits pre-charging and equalizing the voltages of said pairs of said bit lines amplified by said sense amplifiers, respectively;
    word line deactivating means for deactivating at least one of said word lines in an operation mode other than an ordinary operation mode;
    bit line pair potential fixing means for setting voltages of at least one of said pairs of said bit lines to the same logic level in the operation mode other than the ordinary operation mode; and
    sense amplifier deactivating means for deactivating a sense amplifier of said sense amplifiers, said sense amplifier being coupled to said one of said pairs of said bit lines set at the same logic level in the operation mode other than the ordinary operation mode.

2. The semiconductor storage device of claim 1, wherein said word line deactivating means deactivates all of said word lines in the operation mode other than the ordinary operation mode.

3. The semiconductor storage device of claim 2, wherein the operation mode other than the ordinary operation mode is a test mode.

4. The semiconductor storage device of claim 1,
    wherein said bit line pair potential fixing means sets the voltages of said pairs of said bit lines to the same logic level in the operation mode other than the ordinary operation mode, and
    wherein said sense amplifier deactivating means deactivates all of said sense amplifiers in the operation mode other than the ordinary operation mode.

5. The semiconductor storage device of claim 4, wherein the operation mode other than the ordinary operation mode is a test mode.

6. The semiconductor storage device of claim 1, wherein the same logic level is a potential of data of "0" in the ordinary operation mode.

7. The semiconductor storage device of claim 1, wherein the same logic level is a grounding potential.

8. The semiconductor storage device of claim 1,
    wherein a potential of data of "0" of potentials in said pairs of said bit lines is higher than a grounding potential in the ordinary operation mode, and
    wherein said bit line potential fixing means sets at least one of said pairs of said bit lines to the potential of data of "0" in the operation mode other than the ordinary operation mode.

9. The semiconductor storage device of claim 1, wherein the same logic level is a potential of data of "1" in the ordinary operation mode.

10. The semiconductor storage device of claim 1, wherein the same logic level is a power source voltage.

11. The semiconductor storage device of claim 1,
    wherein a potential of data of "1" is lower than a power source voltage in the ordinary operation mode, and
    wherein said bit line potential fixing means sets at least one of said pairs of said bit lines to the potential of data of "1" in the operation mode other than the ordinary operation mode.

12. The semiconductor storage device of claim 1 further comprising a potential supplying circuit for supplying potentials different in the operation mode other than the ordinary operation mode and in the ordinary operation mode to said bit lines through said bit line pre-charge circuit.

13. The semiconductor storage device of claim 1, wherein the operation mode other than the ordinary operation mode is a test mode.

14. A semiconductor storage device comprising:
    a plurality of word lines;
    a plurality of pairs of bit lines;
    a plurality of memory cells disposed at intersections of said word lines and said pairs of said bit lines, respectively, each of said memory cells including:
        a capacitor; and a transistor having a drain coupled to a respective one of said bit lines, a source coupled to said capacitor, and a gate coupled to a respective one of said word lines;

a plurality of sense amplifiers coupled to said pairs of said bit lines, respectively, each of said sense amplifiers amplifying a voltage between each of said pairs of said bit lines;

a plurality of bit line pre-charge circuits disposed at said pairs of said bit lines, respectively, each of said bit line pre-charge circuits pre-charging and equalizing the voltage of each of said pairs of the bit lines amplified by each of said sense amplifiers;

a write amplifier for writing data into said pairs of said bit lines;

word line deactivating means for deactivating at least one of said word lines in an operation mode other than an ordinary operation mode; and sense amplifier deactivating means for deactivating at least one of said sense amplifiers in the operation mode other than the ordinary operation mode; and bit line pair selecting means for selecting at least one of said pairs of said bit lines in the operation mode other than the ordinary operation mode; and bit line pair potential fixing means for supplying a potential along with a writing operation from said write amplifier in the operation mode other than the ordinary operation mode.

15. The semiconductor storage device of claim 14, wherein said word line deactivating means deactivates all of said word lines in the operation mode other than the ordinary operation mode.

16. The semiconductor storage device of claim 14, wherein said sense amplifier deactivating means deactivates all of said sense amplifiers in the operation mode other than the ordinary operation mode, and wherein said bit line pair selecting means selects all of said pairs of said bit lines in the operation mode other than the ordinary operation mode.

17. The semiconductor storage device of claim 14, wherein the operation mode other than the ordinary operation mode is a test mode.

18. A method of testing a semiconductor storage device, said method comprising the steps of:

providing said storage device which includes:
a plurality of word lines;
a plurality of pairs of bit lines;
a plurality of memory cells disposed at intersections of said word lines and said pairs of said bit lines, respectively, each of said memory cells including:
a capacitor; and
a transistor having a drain coupled to one of said bit lines, a source coupled to said capacitor, and a gate coupled to one of said word lines;

a plurality of sense amplifiers coupled to said pairs of said bit lines, respectively; said sense amplifiers amplifying voltages between said pairs of said bit lines, respectively; and a plurality of bit line pre-charge circuits disposed on said pairs of said bit lines, respectively, said bit line pre-charge circuits pre-charging and equalizing the voltages of said pairs of said bit lines amplified by said sense amplifiers, respectively;

writing data into said memory cells in an ordinary operation mode;

applying a potential of opposite data against data written in the memory cells to at least of the pairs of the bit lines in an operation mode, other than the ordinary operation mode, and holding the opposite potential in the pairs of the bit lines; and reading the data in the ordinary operation mode.

19. The method of claim 18, wherein said step of writing the data comprises the step of writing the same data into said memory cells in the ordinary operation mode, and wherein said step of applying the potential of the opposite data, and holding the opposite potential comprises the step of applying the potential of the opposite data to all of the pairs of the bit lines in the operation mode other than the ordinary operation mode, and holding the opposite potential in the pairs of the bit lines.

20. The method of claim 18, wherein the operation mode other than the ordinary operation mode is a test mode.

21. A semiconductor storage device comprising:

a plurality of word lines;
a plurality of pairs of bit lines;
a plurality of memory cells disposed at intersections of said word lines and said pairs of said bit lines, respectively, each of said memory cells including:
a capacitor; and
a transistor having a drain coupled to one of said bit lines, a source coupled to said capacitor, and a gate coupled to one of said word lines;

a plurality of memory cell arrays including said memory cells;

sense amplifiers shared by said memory cell arrays, respectively, a plurality of transfer gates for coupling said pairs of said bit lines of memory cell arrays to said sense amplifiers, respectively;

a plurality of bit line pre-charge circuits disposed in said pairs of said bit lines, respectively, said bit line pre-charge circuits pre-charging and equalizing the voltages of said pairs of said bit lines amplified by said sense amplifiers, respectively;

word line deactivating means for deactivating at least one of said word lines in an operation mode other than an ordinary operation mode;

sense amplifier deactivating means for deactivating at least one of said sense amplifiers in the operation mode other than the ordinary operation mode;

shared gate activating means for activating at least one of said transfer gates in the operation mode other than the ordinary operation mode; and bit line pair potential fixing means for setting voltages of at least one of said pairs of said bit lines to the same level.

22. The semiconductor storage device of claim 21, wherein said word line deactivating means deactivates all of said word lines in the operation mode other than the ordinary operation mode, wherein said sense amplifier deactivating means deactivates all of said sense amplifiers in the operation mode other than the ordinary operation mode, wherein said shared gate activating means for activating all of said transfer gates in the operation mode other than the ordinary operation mode, and wherein said bit line pair potential fixing means sets the voltages of all of said pairs of said bit lines to the same level.

23. The semiconductor storage device of claim 21, wherein the operation mode other than the ordinary operation mode is a test mode.

24. A method of testing a semiconductor storage device, said method comprising the steps of:

provinding said storage device which includes:
- a plurality of word lines;
- a plurality of pairs of bit lines;
- a plurality of memory cells disposed at intersections of the word lines and the pairs of the bit lines, respectively, each of the memory cells including:
  - a capacitor; and
  - a transistor having a drain coupled to one of the bit lines, a source coupled to the capacitor, and a gate coupled to one of the word lines;
- a plurality of memory cell arrays including the memory cells respectively;
- sense amplifiers shared by the memory cell arrays;
- a transfer gate for coupling the pairs of the bit lines of the memory cell arrays to the sense amplifiers; and
- a plurality of bit line pre-charge circuits disposed in the pairs of the bit lines, respectively, the bit line pre-charge circuit pre-charging and equalizing the voltages of the pairs of the bit lines amplified by the sense amplifiers, respectively;

writing data into the memory cells of the semiconductor storage device in an ordinary operation mode;

applying a potential of opposite data against the data written in the memory cell arrays to the pairs of the bit lines in an operation mode other than the ordinary operation mode, and holding the opposite potential in the pairs of the bit lines; and reading the data in the ordinary operation mode.

25. The method of claim 24, wherein the step of writing the data into the memory cells comprises the step of writing the same data into the memory cells in the ordinary operation mode.

26. The method of claim 24, wherein the operation mode other than the ordinary operation mode is a test mode.

\* \* \* \* \*